April 30, 1968 E. E. GUTHRIE 3,381,207

COMPACT FREQUENCY MULTIPLIER

Filed Sept. 23, 1965 3 Sheets-Sheet 1

EVERETT E. GUTHRIE
INVENTOR.
BY Roger S. Borovoy
Stuart Lubitz
ATTORNEY

EVERETT E. GUTHRIE
INVENTOR.
BY Roger S. Borovoy
Stuart Lubitz
ATTORNEY

April 30, 1968 E. E. GUTHRIE 3,381,207

COMPACT FREQUENCY MULTIPLIER

Filed Sept. 23, 1965 3 Sheets-Sheet 3

EVERETT E. GUTHRIE

INVENTOR

BY Roger S. Borovoy
Stuart Lubitz
ATTORNEY

United States Patent Office 3,381,207

Patented Apr. 30, 1968

3,381,207

COMPACT FREQUENCY MULTIPLIER

Everett E. Guthrie, San Jose, Calif., assignor to Fairchild Camera and Instrument Corporation, Syosset, N.Y., a corporation of Delaware Filed Sept. 23, 1965, Ser. No. 489,511
15 Claims. (Cl. 321—69)

ABSTRACT OF THE DISCLOSURE

A frequency multiplier including a low-pass filter, a nonlinear element, and a band-pass filter between input and output has those elements arranged within a housing compactly and with access, such as for tuning or removal, to the nonlinear element. The band-pass filter may be a comb-line filter whose elements are in parallel configuration with a transmission line coupling the low-pass filter and the nonlinear element.

This invention relates to a microwave device and, in particular, to a frequency multiplier for a solid state microwave source.

In recent years the requirement for highly reliable compact high-frequency sources has led to the development of solid state microwave devices. These devices generally include a transistor oscillator and a multiplier. A multiplier is required because operating the transistor oscillator at microwave frequencies of 5 gigacycles or more would result in prohibitive energy losses and poor performance due to the transit time of carriers. The energy losses are largely attributable to bulk resistance losses of the various semiconductor regions while the transit time is a function of carrier mobility. Thus, a multiplier is required to enable the transistor oscillator to operate at a relatively low frequency and at a relatively high efficiency, and to bring the transistor oscillator output frequency up to the desired microwave frequency.

The multiplier component of a solid state microwave source is the primary concern of this invention. Multipliers are similar in construction to such devices as frequency converters and harmonic generators. In this specification the term "multiplier" is used in a generic sense and includes all of these devices in addition to other similar structures. In the past, multipliers have employed an input filter, such as a low-pass filter, coupled in series or parallel to a diode which generates a plurality of harmonics. The diode in turn is connected to an output filter, such as a band-pass filter.

The prior art band-pass filters have included such devices as interdigital band-pass filters, described in "Interdigital Band-pass Filters" by Matthaei, G. L., PGMTT, November, 1962, pages 479–91. Interdigital band-pass filters were at one point thought to be optimum for compact multipliers. However, today the marketplace demands smaller broadband sources and, consequently, more compact and simpler band-pass filter arrangements for multipliers are required.

In microwave sources the interconnection arrangement of the elements is an all important factor in the construction of an efficient and broadband device. Even the smallest length of interconnection lead can seriously deteriorate broadband operation and the efficiency of the source. In this respect, the prior art has yet to realize an optimum configuration.

The multiplier of this invention comes to grips with all of these problems and provides a relatively simple, compact source capable of efficient broadband operation. These results are accomplished by employing a low-pass filter, a nonlinear element for the generation of harmonics, and a band-pass filter interconnected in a novel manner.

The manner in which the elements are interconnected and the general relationship of the impedance values of the elements enables improved operation. In this respect the low-pass filter has an impedance that stops all frequencies but the desired input frequency $f_0$ and that forms an approximate short circuit for the desired output frequency $Nf_0$, where N is an integer designating the harmonic to be employed as the output frequency. The low-pass filter is coupled to the nonlinear element by a transmission line which passes input frequency $f_0$ to the non-linear element and also couples the output frequency $Nf_0$ from the nonlinear element to the band-pass filter. The nonlinear element is arranged in the multiplier so that it may readily be tuned, removed or replaced. To accomplish this, the nonlinear element, the output from the low-pass filter, and the input to the band-pass filter are arranged in an unusual manner. Another aspect of the invention is the use of a comb-line filter as the band-pass filter. The comb-line filter is the smallest multi-resonant microwave filter reported in the literature and contributes substantially to the simplicity, compactness and efficiency of the multiplier. And finally, the elements are arranged in a rectangular housing in such a manner that space is conserved.

Briefly, the structure of the invention comprises a low-pass filter means for passing signals having a frequency of approximately $f_0$, where $f_0$ is the frequency of a signal supplied to the multiplier; a nonlinear element for generating a signal having a frequency $Nf_0$, where N is an integer greater than one; a band-pass filter means for passing the frequency $Nf_0$ and for rejecting other frequencies; an input transmission line means for coupling the $f_0$ signals from the low-pass filter to the nonlinear element and for coupling the $Nf_0$ signals from the nonlinear element to the comb-line filter, said input transmission line and said nonlinear element arranged in sequence with respect to said low-pass filter, and output means coupled to the comb-line filter for supplying the output signal $Nf_0$ to a load, whereby the multiplier is supplied with an input signal having a frequency $f_0$ and supplies an output signal having a frequency $Nf_0$.

The above generally described structure and its advantages will be more fully understood when the detailed description which follows is read in conjunction with the accompanying drawings. Referring to the drawings.

Figure 1:
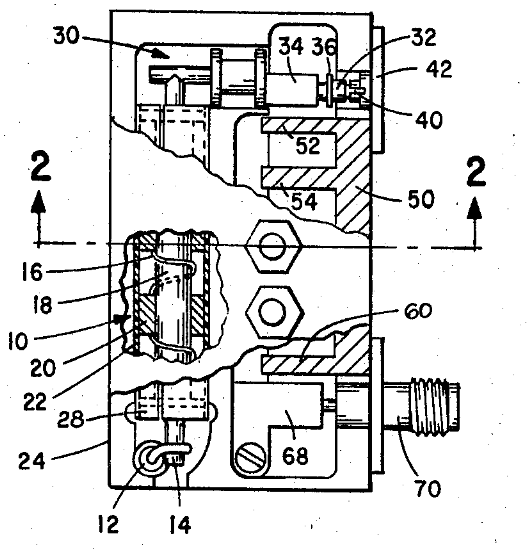
FIG. 1 is a partial sectional view of the microwave multiplier showing the overall combination and arrangement of a low-pass filter, nonlinear element and band-pass filter.
Figure 2:
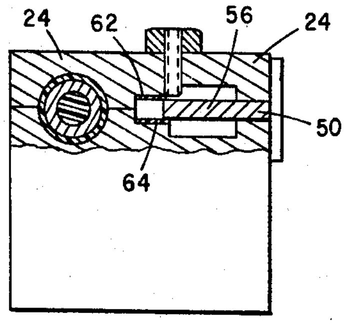
FIG. 2 is a partial sectional elevation view showing a section taken along the lines 2—2 of FIG. 1.

Referring to FIGS. 1 and 2, an input frequency $f_0$ is supplied to the low-pass filter means 10 via an input lead 12. The input lead 12 is connected to a transmission line 14 which terminates in the low-pass filter 10. The low-pass filter 10 includes a dielectric or Teflon rod 18 that has a plurality of discs, such as brass disc 20, spaced along its length and a coil 16 wrapped around its length. The coil 16, rod 18 and disc 20 are mounted within a tube 22 made from a dielectric material, such as Teflon. The tube 22 is mounted in a housing 24 made from such material as brass. The brass disc 10, Teflon sleeve 22 and brass housing 24 provide part of the filter capacitance while the coil 16 provides a distributed inductance and a distributed shunt capacitance. The shunt capacitance and the capacitance attributable to elements 20, 22 and 24, as shown in FIG. 1, form the capacitance in the equivalent circuit for the filter. The coil 16 forms the inductance in the equivalent circuit.

The low-pass filter 10 has one portion 28 located along one side of the rectangular housing 24 while its terminal portion 30 is located along another side of the rectangular housing 24 at right angles to the first portion. This arrangement facilitates the construction of a more compact microwave source.

Figure 3:
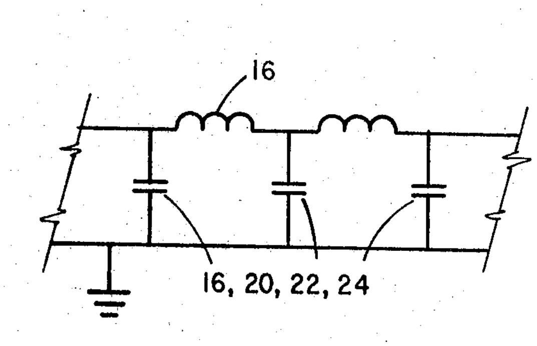
FIG. 3 is an electrical schematic diagram of the low-pass filter.
Figure 4:
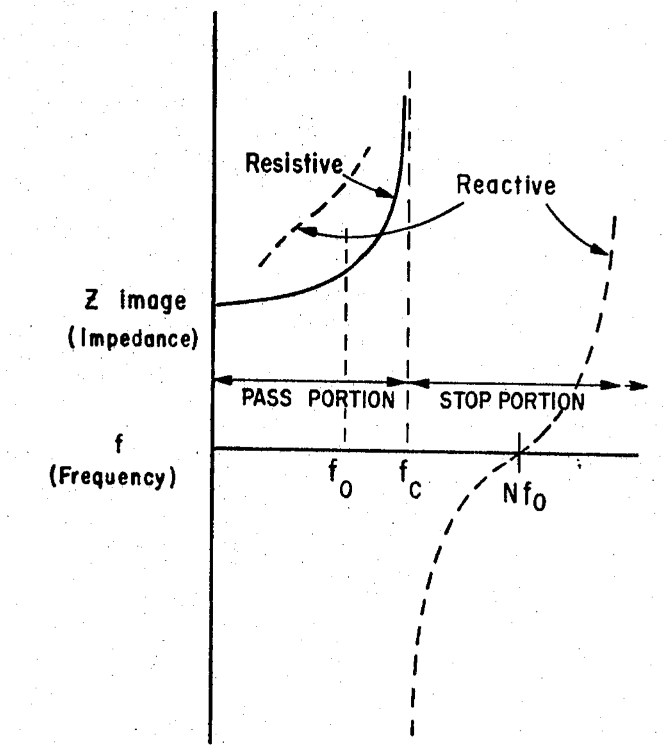
FIG. 4 is an image impedance-frequency graph of the low-pass filter.

The low-pass filter 10 passes the input frequency $f_0$ with low losses and tends to stop all low-order harmonics of this frequency and especially the harmonic frequency $Nf_0$ which is the desired output frequency of the multiplier. In the preferred form, the term N may be any integer greater than one but it is within the broad scope of the invention for N to assume fractional values. The input frequency $f_0$ typically ranges between 0.5–2.0 gigacycles. The operation of the low-pass filter can be readily understood by reference to FIGS. 3 and 4 which show the electrical schematic and graphical representation of such a filter circuit, commonly referred to as a pi-type filter. As shown in FIG. 4, this filter design is complex in the pass-band and has an inductive reactance component. The stop portion (FIG. 4) has an impedance that is imaginary and, consequently, frequencies above the cutoff frequency $f_c$ are rejected. It should be noted that the low-pass filter is designed so that it presents essentially zero impedance at the output frequency $Nf_0$ which is the equivalent to presenting a short circuit to such frequencies. Thus, the frequency $Nf_0$ will not pass through filter 10 but will be shorted to ground. The parameters of low-pass filter 10 are also adjusted to match the impedance of nonlinear element 32 so that maximum power transfer occurs between them at the frequency $f_0$. More details on the specific design of a low-pass filter are contained in such publications as "VHF Techniques," vol. 11, page 687, Harvard University, McGraw-Hill Book Co. (1947). It is within the broad scope of the invention to employ other filter arrangements to achieve the desired filtering of the input signal. For example, band-pass filters, low-pass and high-pass filters and various combinations of these filters may be employed.

The low-pass filter 10 is connected to nonlinear element 32 by input coupling or band-pass filter input transmission line 34. The input line 34 is connected to the terminal section 30 of low-pass filter 10 and has nonlinear element 32 removably mounted therein. Element 32 may include a varactor diode 36 which functions as a nonlinear means for generating harmonics.

It should be noted that the usual arrangement of elements for a comb-line filter would have the element 32 connected to the low-pass filter section 30 and the line 34 in turn connected to the element 32. The opposite end of line 34 is then grounded to output filter housing. While this arrangement is within the broad scope of the invention, a more specific and significant aspect of the invention employs the line 34 and element 32 connected in sequence to the filter section 10. The advantages of this arrangement will be apparent from the description which follows.

Figure 5:
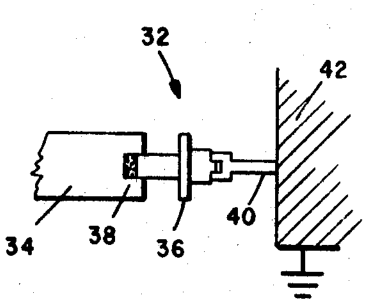
FIG. 5 is a detailed showing of the nonlinear element and its tuning structure.

The connection between transmission line 34 and diode 36 is shown in detail in FIG. 5. One end of diode 36 is received by an opening 38 in the transmission line 34 which contains a contact material. The contact material may take the form of a "fuzz button" of threaded gold and other conductive material that is compressed in opening 38 by the end of diode 36. The other end of diode 36 is connected to a stub tuning means 40 for tuning the resonant frequency of diode 36 to resonate at the output frequency $Nf_0$. The end of stub tuning means 40 removably receives the end of diode 36 and in turn is removably connected to the housing by holding means 42

(FIG. 1). From this it can be seen that stub tuning means 40 may readily be removed from the housing to replace diode 36 in the event of a malfunction. It should be noted that diode 36 is connected in series with the filters 10 and 50 but it is within the broad scope of the invention to connect the diode in parallel with these filters.

Figure 6:
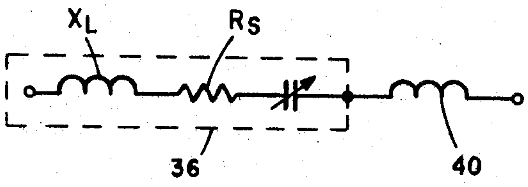
FIG. 6 is a schematic diagram of the equivalent circuit for the nonlinear element and its lead.
Figure 7:
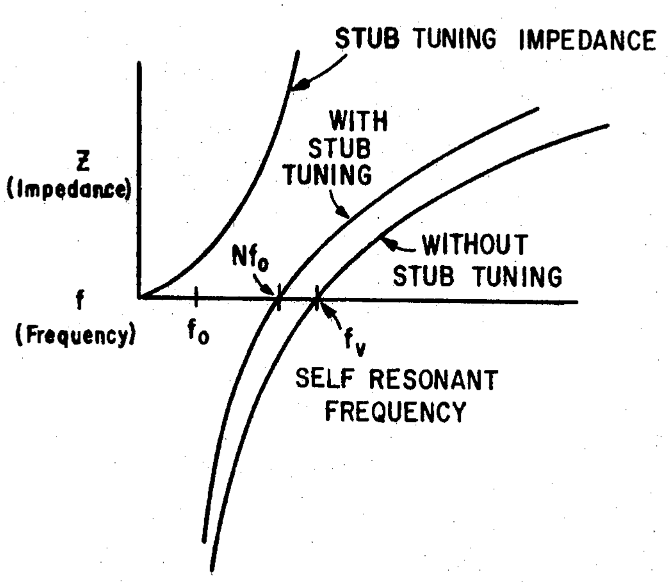
FIG. 7 is an impedance-frequency graph for the nonlinear element and the tuning structure.

As shown in FIG. 6, varactor diode 36 has an electrical equivalent circuit of a resistor (spreading resistance $R_s$), and a variable capacitor in series with the lead inductance $X_L$. This electrical equivalent is completely discussed in the book "Varactor Applications" by P. Penfield and R. P. Rafuse, MIT Press, 1962, pages 297–435, which also discusses the use of the varactor diode as a harmonic generator. The stub tuning means 40 provides the additional inductance necessary for diode 36 to resonate at the desired output frequency $Nf_0$. This is graphically shown in FIG. 7 where the point at which the impedance-frequency curve crosses the frequency axis is shifted by the addition of the stub tuning means impedance. By this addition the self-resonant frequency of diode 36 shifts from the frequency $f_v$ to the frequency $Nf_0$.

With diode 36 adapted to resonate at $Nf_0$ and low-pass filter 10 short-circuited at $Nf_0$, frequency $Nf_0$ is coupled from diode 36 through transmission line 34 to the band-pass filter 50. The length of line 34, which may be between ⅛ and 1/12 of a wavelength at the output frequency $Nf_0$, tends to present a short circuit or low impedance to harmonics below the desired $N^{th}$ harmonic that are rejected by band-pass filter 50. These frequencies are, thus, transmitted to diode 36 and mixed with frequency $f_0$. This mixing increases the efficiency of the generation of frequency $Nf_0$ by the multiplier. Such mixing results in the generation of frequencies other than $Nf_0$, which, however, are rejected by filters 10 and 50 and again mixed.

The band-pass filter 50 may tahe the form of a comb-line filter which has a plurality of conductive stubs 52–60 made from brass, aluminum or other good conductors. The stubs 52–60 are located along a third side of the housing which is at a right angle to the second side (along which transmission line 34 and diode 36 are mounted). These stubs have a length and spacing proportioned to pass an appropriate band of frequencies centered about the frequency $Nf_0$, and to reject the fundamental frequency $f_0$ and all harmonics around the frequency $Nf_0$. The length of the individual stubs is less than a quarter wavelength at the frequency $Nf_0$ with their ends capacitively loaded by a pair of low-loss dielectric strips 62 and 64 which separate the metal stubs 52–60 from metal housing 24 (FIG. 2). The capacitive loading of the ends of stubs enable short-stub lengths to be employed. The specific details of designing a comb-line filter are described in detail in articles such as "Comb-Line Band-Pass Filters for Narrow or Moderate Bandwidth" by George L. Matthaei, Microwave Journal, pages 82–91 (August 1963). It is within the broad scope of the invention to employ other band-pass filters employing TEM construction such as interdigital filters and others.

The last stub 60 of comb-line filter 50 is coupled to output transmission line 68 which is mounted directly on housing 24 and is, therefore, short-circuited. The frequency $Nf_0$ passes to output transmission line 68 and from there to output connector 70.

In summary, the invention comprises a multiplier having a low-pass filter 10 that is adapted to pass input frequency $f_0$ while rejecting its lower order harmonics, especially frequency $Nf_0$. The low-pass filter 10 has an impedance matched to the diode 36 about $f_0$ to facilitate maximum power transfer at that frequency. In addition, low-pass filter 10 presents a short circuit to diode 36 at the output frequency $Nf_0$. This tends to load diode 36 at frequency $Nf_0$ (which is the self-resonating frequency of the diode 36) as adjusted by the stub tuning means 40. With the diode so adjusted and loaded, the frequency $Nf_0$ passes to transmission line 34 with maximum power and is then transferred to the comb-line filter 50. The power transfer to comb-line filter 50 is facilitated by transmission line 34 which is attached to low-pass filter 10, and by band-pass filter output transmission line 68 which is attached directly to housing 24. The power transferred to output transmission line 68 is supplied to the output connector 70.

The impedance matching thus far has only been concerned with $f_0$, $Nf_0$ and their harmonics. Actually, useful bandwidths centered at $Nf_0$ have been observed that are as much as 15 percent wide. Such a bandwidth is terminated about the 1 db points. This means that line lengths between filters and diodes will have been minimized so that no narrow banding results due to external microwave circuit elements unless it is intentionally built into the output band-pass filter. The bandwidth is then only limited by the Q of the diode plus the diode stub tuning, if any. Thus, the multiplier is inherently a broadband circuit with a typical operating range of 5.4 to 5.9 gigacycles at an $f_0$ of 1.08 to 1.18 gigacycles and an N of 5.

In addition to the above structural features giving rise to efficient broadband operation, diode 36 is removably mounted for ease of replacement and is readily accessible for the attachment of bias circuitry where desirable. The multiplier maintains excellent performance in spite of its highly desirably compactness, facilitated by incorporating the comb-line filter.

The foregoing arrangement and interconnection of multiplier elements may easily be applied to a multiplier using an interdigital filter in place of a comb-line filter since they are both coupled resonator filters. However, the interdigital filter always uses quarter wave resonators and would, therefore, be larger than a comparable comb-line design.

While the above-detailed description has pointed out the fundamental novel features of the invention as applied to a preferred embodiment, it will be understood that various omissions and substitutions and changes in the form and details of the illustrated device may be made by those skilled in the art without departing from the spirit and scope of the invention. It is the intention, therefore, to be limited only as indicated by the following claims:

1. A microwave multiplier comprising:

a low-pass filter means for passing signals having a frequency of approximately $f_0$, where $f_0$ is the frequency of a signal supplied to said multiplier;

a nonlinear element for generating a signal having a frequency $Nf_0$, where N is an integer greater than one;

a band-pass comb-line filter means for passing the frequency $Nf_0$ and for rejecting other frequencies, said comb-line filter means comprising a plurality of conductive stubs;

an input transmission line means for coupling said $f_0$ signals from said low-pass filter means to said nonlinear elements and for coupling said $Nf_0$ signals from said nonlinear element to said combline filter means, said input transmission line means comprising a length of transmission line coupled serially between said low-pass filter and said nonlinear element, said length of transmission line also disposed in parallel arrangement with said conductive stubs of said comb-line filter means; and an output means coupled to said comb-line filter means for supplying the output signal $Nf_0$ to a load, whereby the multiplier is supplied with an input frequency $f_0$ and supplies an output signal having a frequency $Nf_0$.

2. A microwave multiplier in accordance with claim 1 wherein: said nonlinear element and said low-pass filter have matched impedance values for maximum power transfer at the input frequency $f_0$ and the impedance of said low-pass filter has a value that presents a short circuit at the frequency $Nf_0$.

3. A microwave multiplier in accordance with claim 1 wherein: said length of transmission line has a length that does not couple frequency $f_0$ to said comb-line filter means and that does couple frequency $Nf_0$ to said comb-line filter means.

4. A microwave multiplier in accordance with claim 1 wherein: said nonlinear element and said low-pass filter have matched impedance values for maximum power transfer at the input frequency $f_0$ and the impedance of said low-pass filter has a value that presents a short circuit at the frequency $Nf_0$; said length of transmission line has a length that does not couple frequency $f_0$ to said comb-line filter means and that does couple frequency $Nf_0$ to said comb-line filter means.

5. A microwave multiplier in accordance with claim 1 wherein: said nonlinear element has a tuning means for adjusting its self-resonant frequency to resonate at the frequency $Nf_0$.

6. A microwave multiplier in accordance with claim 1 wherein: said comb-line filter means presenting a short circuit to said nonlinear element at harmonic frequencies below $Nf_0$ to load said nonlinear element and maximize the generation of $Nf_0$ frequency signals.

7. A solid-state microwave multiplier comprising:

a housing;

a low-pass filter means for passing signals having a frequency of approximately $f_0$, where $f_0$ is the frequency of a signal supplied to said multiplier;

a diode harmonic generator means for generating a signal having a frequency $Nf_0$, where N is an integer greater than one;

a band-pass comb-line filter means for passing the frequency $Nf_0$ and for rejecting other frequencies, said comb-line filter means comprising a plurality of transmission lines in side-by-side relationship extending from one side of said housing towards another side of said housing and reactively terminated intermediate said sides;

an input transmission line means for coupling said $f_0$ signals from said low-pass filter means to said diode means and for coupling said $Nf_0$ frequencies from said diode means to said comb-line filter means, said transmission line means comprising a length of transmission line connected serially between the low-pass filter means and adapted to removably receive said diode means, said length of transmission line also disposed in parallel arrangement with said plurality of transmission lines of said comb-line filter means;

a tuning means removably connected to said diode means and said housing for tuning the resonant frequency of said diode means; and, an output means coupled to said comb-line filter means for supplying the output signal $Nf_0$, whereby the solid-state microwave multiplier supplies an output frequency having a value $Nf_0$.

8. The structure defined in claim 7 wherein said transmission line means is directly connected to said low-pass filter at one end and said diode means at said other end, said tuning means adjusts the impedance of said diode to resonate at said frequency $Nf_0$, and said comb-line filter means includes said transmission line means.

9. The structure defined in claim 8 wherein said low-pass filter means has its impedance matched to said diode means for maximum power transfer at the frequency $f_0$, and presents a short circuit to said diode means at the frequency $Nf_0$ and said diode means is a semiconductor diode.

10. A solid-state microwave multiplier in accordance with claim 7 wherein: said housing is rectangular; said low-pass filter means is located along first and second perpendicular sides of said rectangular housing; said diode is located at the extremity of said low-pass filter means along said second side of said housing; said comb-line filter means is located along a third side of said housing perpendicular to said second side with said length of transmission line and said plurality of transmission lines of said comb-line filter means all parallel to said second side.

11. A multiplier for producing transverse electromagnetic energy at microwave frequency comprising:

a housing having three ports;
a low-pass filter within said housing;
an input lead connected to said low-pass filter and extending from said housing through a first of said ports;
a nonlinear element coupled to said low-pass filter, said nonlinear element being removably secured within a second of said ports;
a comb-line band-pass filter coupled to said nonlinear element;
an output transmission line connected to said band-pass filter and extending from a third of said ports.

12. The subject matter of claim 11 wherein: a single length of transmission line couples said nonlinear element to said low-pass filter and also couples said band-pass filter to said nonlinear element; said housing is conductive; said nonlinear element is a diode having a first terminal conductively removably secured within an opening in said single length of transmission line and having a second terminal connected to stub tuning means at said second port, said stub tuning means being shorted to said housing.

13. The subject matter of claim 11 wherein: said housing has a rectangular configuration having four sides with said low-pass filter, said diode, and said band-pass filter arranged therein in a rectangular configuration along said sides; said low-pass filter extends along a first side and a second side perpendicular to said first side to said diode and aid band-pass filter extends along a third side parallel to said first side; said first port is proximate a corner of said housing formed by said first side and a fourth side; said second port is proximate a corner of said housing formed by said second side and said third side; and said third port is proximate a corner of said housing formed by said third side and said fourth side.

14. The subject matter of claim 12 wherein: said band-pass filter is a comb-line filter of a plurality of parallel transmission lines to which said single length of transmission line is parallel.

15. The subject matter of claim 11 wherein: a single length of transmission line couples said nonlinear element to said low-pass filter and also couples said band-pass filter to said nonlinear element; said housing is conductive; said nonlinear element is a diode having a first terminal conductively removably secured within an opening in said single length of transmission line and having a second terminal connected to stub tuning means at said second port, said stub tuning means being shorted to said housing; said housing has a rectangular configuration having four sides with said low-pass filter, said diode, and said band-pass filter arranged therein in a rectangular configuration along said sides; said low-pass filter extends along a first side and a second side perpendicular to said first side to said diode and said band-pass filter extends along a third side parallel to said first side; said first port is proximate a corner of said housing formed by said first side and a fourth side; said second port is proximate a corner of said housing formed by said second side and said third side; and said third port is proximate a corner of said housing formed by said third side and said fourth side; said band-pass filter is a comb-line filter of a plurality transmission lines to which said single length of transmission line is parallel.

References Cited

UNITED STATES PATENTS

| | | | |
|---|---|---|---|
| 3,194,976 | 7/1965 | Ludwig et al. | 321—69 |
| 3,196,339 | 7/1965 | Walker et al. | 321—69 |
| 3,311,812 | 3/1967 | Geiszler et al. | 321—69 |

JOHN F. COUCH, *Primary Examiner.*

G. GOLDBERG, *Assistant Examiner.*